(12) United States Patent
Tomaru

(10) Patent No.: US 11,989,623 B2
(45) Date of Patent: May 21, 2024

(54) QUANTUM COMPUTER AND QUANTUM STATE CONTROLLING METHOD IN QUANTUM COMPUTER

(71) Applicant: Hitachi, Ltd., Tokyo (JP)

(72) Inventor: Tatsuya Tomaru, Tokyo (JP)

(73) Assignee: HITACHI, LTD., Tokyo (JP)

( * ) Notice: Subject to any disclaimer, the term of this patent is extended or adjusted under 35 U.S.C. 154(b) by 151 days.

(21) Appl. No.: 17/687,751

(22) Filed: Mar. 7, 2022

(65) Prior Publication Data

US 2022/0398481 A1 Dec. 15, 2022

(30) Foreign Application Priority Data

Jun. 10, 2021 (JP) .................................. 2021-097298

(51) Int. Cl.
*G06N 10/20* (2022.01)
*G01R 33/44* (2006.01)

(52) U.S. Cl.
CPC ............. *G06N 10/20* (2022.01); *G01R 33/44* (2013.01)

(58) Field of Classification Search
CPC ......... G06N 10/00; G06N 10/20; G01R 33/44
USPC ............................................... 326/1; 716/100
See application file for complete search history.

(56) References Cited

U.S. PATENT DOCUMENTS

2023/0093578 A1* 3/2023 Ruskuc .................. G06N 10/00
716/100

FOREIGN PATENT DOCUMENTS

JP 2013-114366 A 6/2013

* cited by examiner

*Primary Examiner* — Arnold M Kinkead
(74) *Attorney, Agent, or Firm* — MATTINGLY & MALUR, PC

(57) ABSTRACT

The present invention aims at enabling a gate-type quantum computer to deal with actual problems. There is provided a quantum computer including: a quantum register holding qubits, a control gate performing an operation on the quantum register, and a readout unit observing a state of the quantum register; and the quantum computer repeating longitudinal relaxation to the ground state by gradually changing Hamiltonian H(t) for a predetermined time, wherein the unitary operation determined by the Hamiltonian H(t) at each time is performed with the control gate for a time of about a longitudinal relaxation time, the quantum state is relaxed every time of about the longitudinal relaxation time, and the ground state prepared for an initial state is time-evolved to the ground state of the Hamiltonian which is defined as a problem.

15 Claims, 12 Drawing Sheets

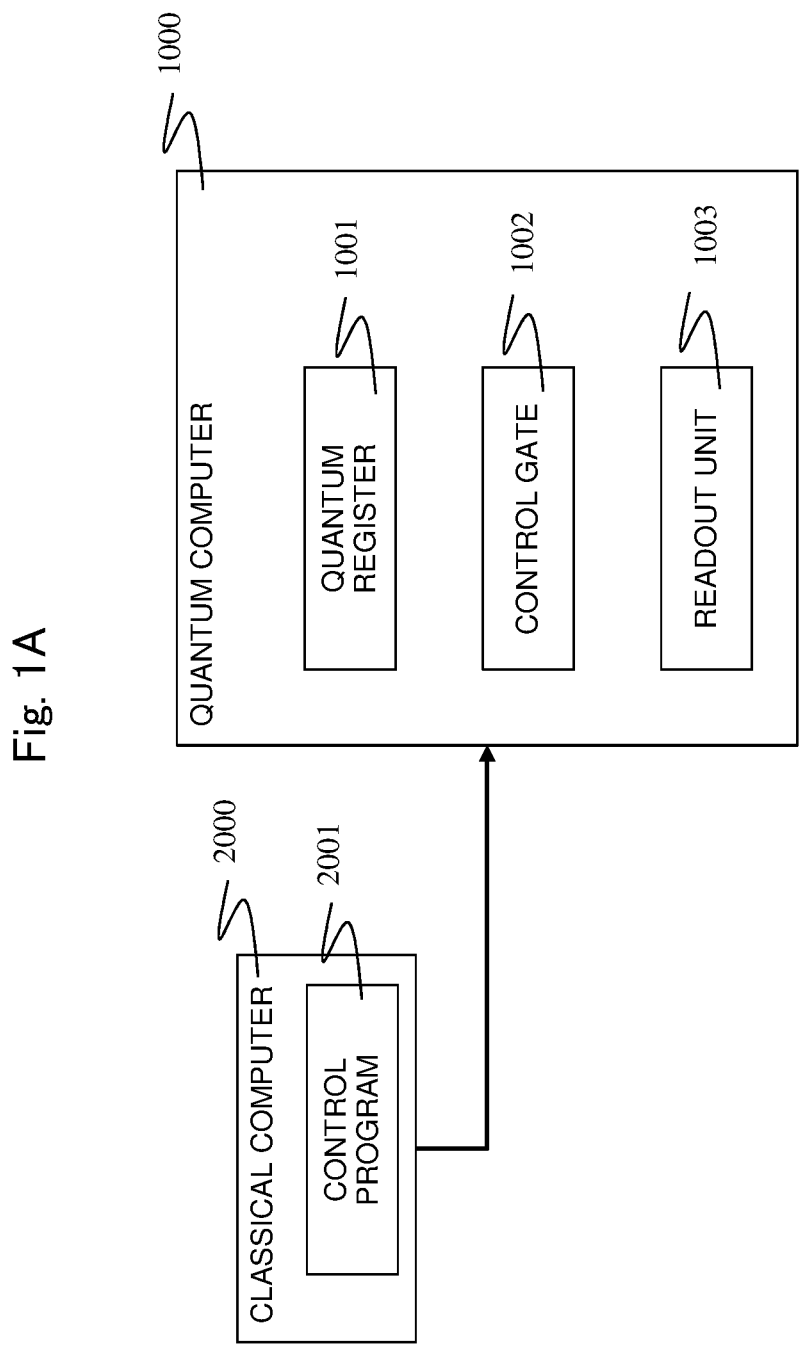

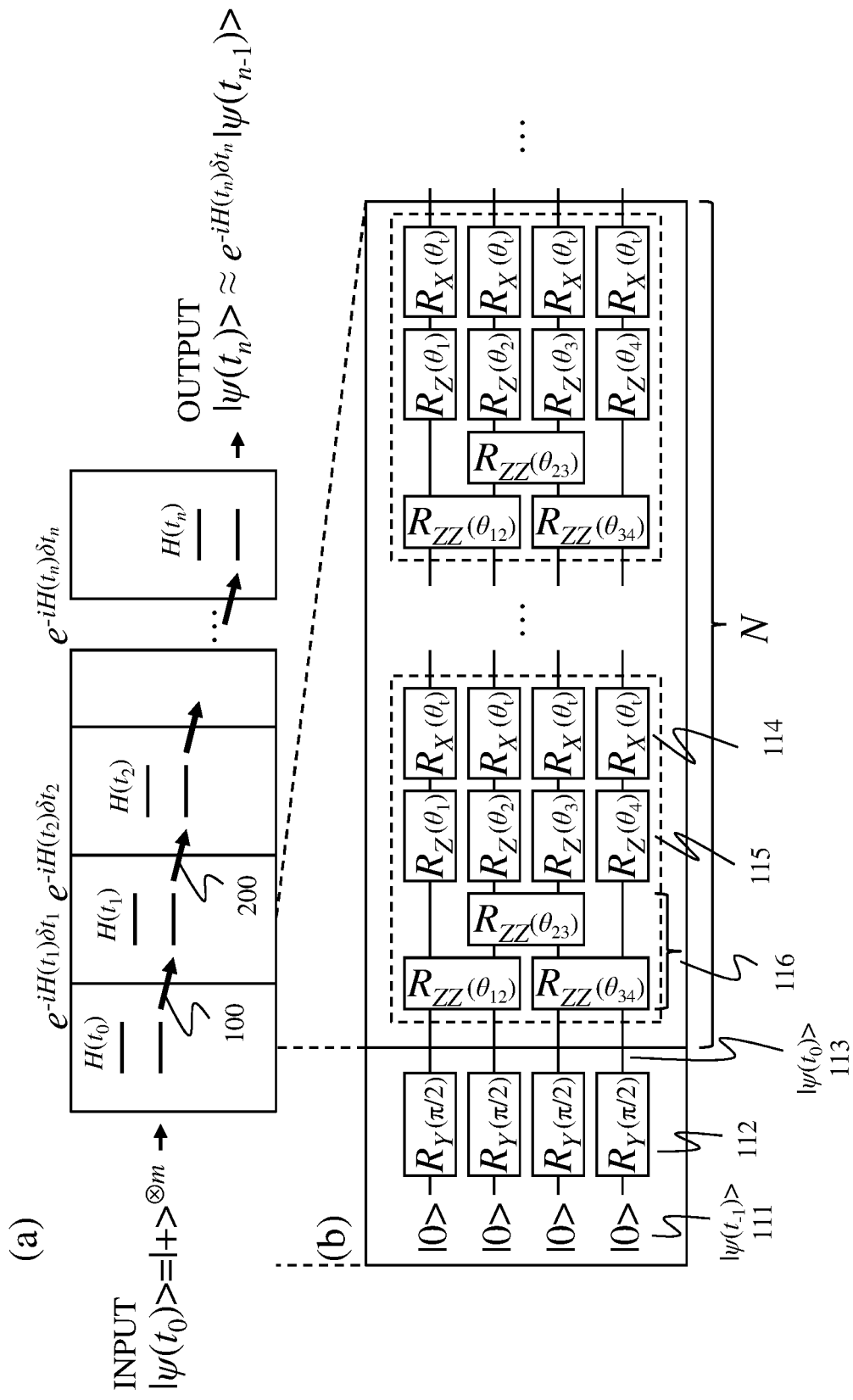

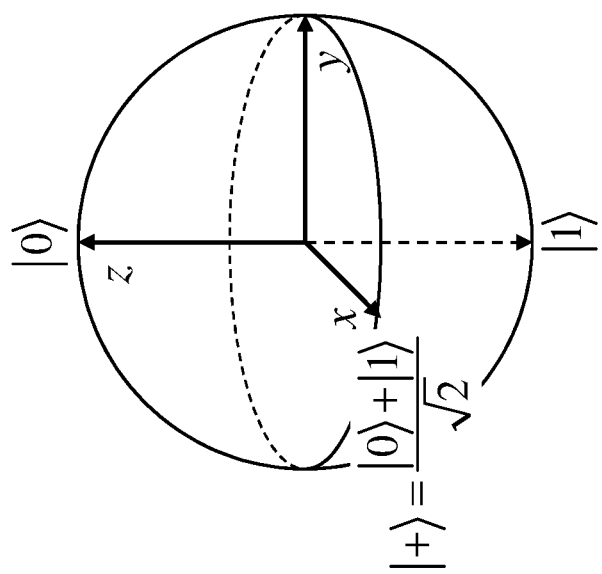

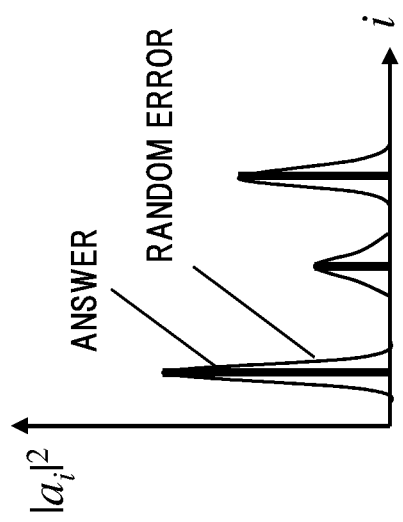

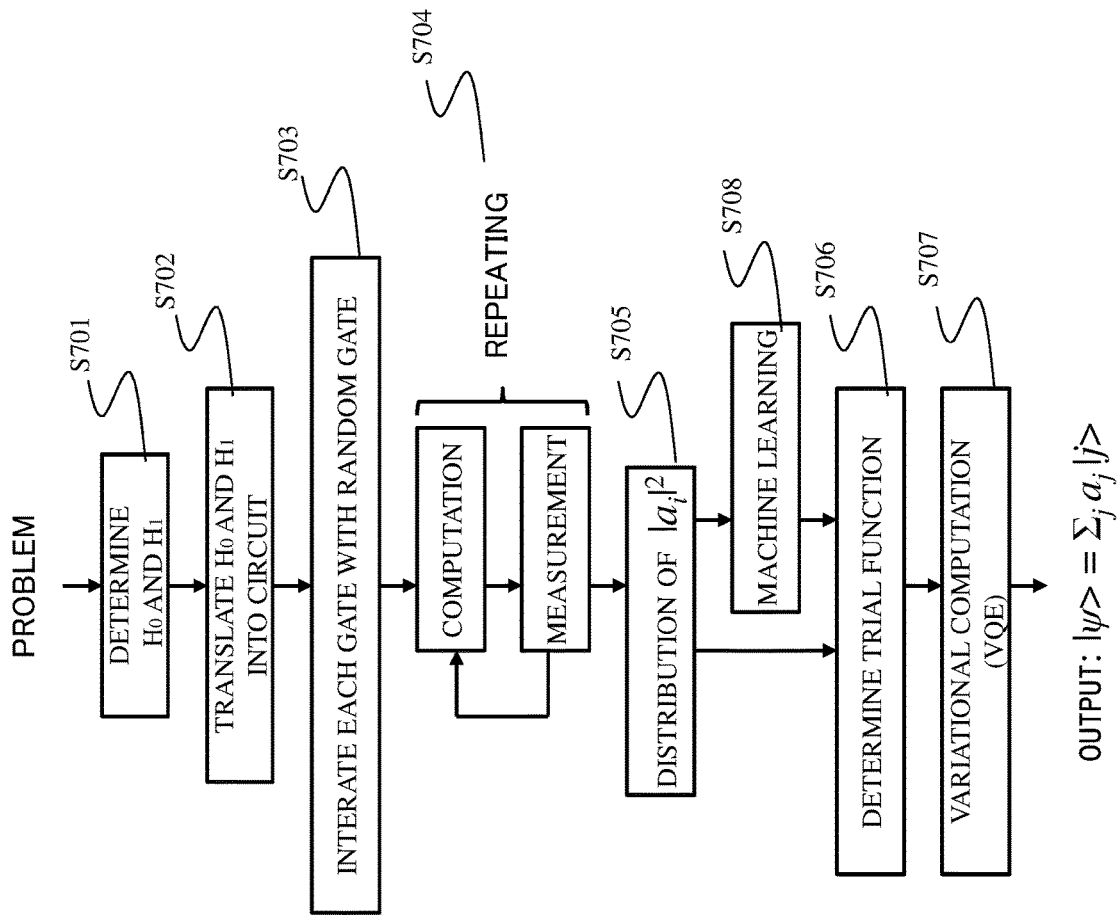

QUANTUM COMPUTER AND QUANTUM STATE CONTROLLING METHOD IN QUANTUM COMPUTER

CROSS-REFERENCE TO RELATED APPLICATION

The present application claims priority from Japanese application JP 2021-097298, filed on Jun. 10, 2021, the contents of which is hereby incorporated by reference into this application.

BACKGROUND OF THE INVENTION

1. Field of the Invention

The present invention relates to a technology of a computer, particularly, a quantum computer.

2. Description of the Related Art

In an IT society, there are limitless demands on computer performance, and quantum computers are highly expected as a target to meet the demands. The trigger that the quantum computers attracted attention from us was a prime factorization algorithm contrived by Shor, and the algorithm proved that the quantum computers can perform information processing at a higher speed than classical computers. Thereafter, Shor's algorithm was generalized to the phase estimation algorithm, followed by the invention of an HHL algorithm, capable of solving simultaneous equations at a high speed, and the like. Another algorithm that increased the expectations of the quantum computers is Grover's search algorithm, which was generalized to the amplitude amplification algorithm and has been developed into the amplitude estimation algorithm by combined with the phase estimation algorithm.

Although the algorithms for quantum computers are promising, they assume quantum computers with no errors. However, a bit error and a phase error may always occur because the quantum computer uses a qubit that is a linear superposition state of $|0\rangle$ and $|1\rangle$ as a basic unit, and in that sense, the qubit is analog. Although an error-tolerant quantum computer is achievable with quantum error correction, a large-scale quantum computer with a sufficiently small error rate needs to become reality in order to achieve the error-tolerant quantum computer. For this reason, there is no prospect of the reality.

In accordance with this situation, a concept of a noisy intermediate-scale quantum (NISQ) computer has been attracting attention in recent years. This aims at operating a medium-scale quantum computer (the number of qubits is about 50 to several hundreds) without error correction. Although it has been proven that the fact that the NISQ computers can execute tasks faster than the classical computers (quantum supremacy), what can be demonstrated is to generate random numbers via quantum interference, which belongs to a specialized class and is not an actual problem. That is, an algorithm for solving actual problems by the NISQ computer is an unsolved problem.

There is also a technology called quantum annealing in computing using a quantum technology. The above-mentioned quantum computer is sometimes called a gate-type quantum computer to distinguish the above-mentioned quantum computer from the quantum annealing.

The quantum annealing is a method of translating a problem into another one such that the solution is the ground state of Hamiltonian $H_0$ setting the initial state to the ground state of Hamiltonian $H_1$ under which the ground state is easily prepared, and gradually changing the Hamiltonian from $H_1$ to $H_0$ to finally obtain the ground state of $H_0$. The quantum annealing is founded on the adiabatic theorem, and assumes continuing quantum coherence as a theoretical foundation. In this method, the form of $H_0$ is limited depending on hardware, and usually takes the form called the Ising spin Hamiltonian. For this reason, problems that are easily treated are limited, and it is greatly complicated and difficult to treat general problems. In addition, the Ising spin takes two states of +1 or −1, and a linear superposition state is not assumed as a solution. That is, a classical solution is assumed and cannot be applied to a problem that becomes a quantum mechanical solution.

There is also a method using the Zeno effect as a method similar to the quantum annealing. The method is similar to the quantum annealing in the sense that the ground state of $H_1$ is set as a starting point and the ground state of $H_0$ is finally obtained. The different point is that repeated measurements are performed in the computation to fix the state at each time. The method assumes the phase estimation algorithm as a basic measurement method, but other measurements may be used as long as the state is fixed there. However, specific measurement methods have not been clarified other than the phase estimation algorithm, and time evolution assumes quantum coherence continuing.

As a quantum computer system in the related art, for example, in JP 2013-114366 A, disclosed is a quantum computer system including: a quantum unit having a quantum register configured with at least one qubit, a control gate performing an operation on the quantum register, and a readout gate observing a state of the quantum register; a classical storage device; and a control device being accessible to the classical storage device, wherein the classical storage device stores a quantum microcode which is a sequence of operation commands for the control gate or the readout gate, and wherein the control device reads the quantum microcode from the classical storage device and controls the control gate or the readout gate.

As described above, in the NISQ computers, the algorithm to solve actual problems has not been known. Quantum annealing does not have a degree of freedom in a Hamiltonian form owing to the limitation regarding hardware, and in a case of an Ising spin type, the quantum annealing cannot be applied to quantum mechanical problems. The method using a Zeno effect has not been specified regarding repeated measurements and is just a theoretical concept. In addition, the theories of the quantum annealing and the Zeno effect method assume that quantum coherence is maintained, and thus it is difficult to perform the quantum annealing and the Zeno effect method along their theory with actual quantum technologies. As described above, any methods have problems, and there is no method capable of dealing with general problems. Thus, the target is to put into practice a quantum computer capable of dealing with general problems.

SUMMARY OF THE INVENTION

Therefore, the present invention aims at enabling a gate-type quantum computer to deal with actual problems.

According to a preferred aspect of the present invention, there is provided a quantum computer including: a quantum register holding qubits, a control gate performing an operation on the quantum register, and a readout unit observing a state of the quantum register; and the quantum computer repeating longitudinal relaxation to the ground state by gradually changing a Hamiltonian H(t) for a predetermined time, wherein a unitary operation determined by the Hamiltonian H(t) at each time is performed with the control gate for a time span of about a longitudinal relaxation time, the quantum state is relaxed for each time span of about the longitudinal relaxation time, and the ground state prepared for an initial state time-evolves to the ground state of the problem Hamiltonian.

According to another preferred aspect of the present invention, there is provided a method of controlling a quantum state of a quantum computer having a quantum register holding qubits, a control gate performing an operation on the qubits, and a readout unit observing a state of the qubits; the quantum computer controlling the qubits with the control gate; the method including: allowing the control gate to control the qubits, and gradually changing the Hamiltonian H(t) for a predetermined time, where longitudinal relaxation to the ground state is repeated every span of about the longitudinal relaxation time by allowing the control gate to perform a unitary operation determined by the Hamiltonian H(t) at each time of each time span, thereby to make the quantum state relax every time span of about the longitudinal relaxation time; and through those operations, the ground state prepared for the initial state time-evolves to the ground state of the problem Hamiltonian.

As a result of this invention, a gate-type quantum computer becomes to be able to deal with actual problems.

BRIEF DESCRIPTION OF THE DRAWINGS

FIG. 1A is a block diagram illustrating a hardware configuration of an embodiment;

FIG. 1B is a diagram illustrating a principle of the embodiment. FIG. 1B(a) illustrates the diagram in the viewpoint of an energy diagram. FIG. 1B(b) illustrates an example of a specific quantum circuit;

FIG. 2 is a conceptual diagram illustrating a relationship between a Bloch sphere and a qubit;

FIG. 3 is an image diagram of a probability distribution obtained with a method of the embodiment;

FIG. 7 is a flow chart illustrating a series of flows according to the embodiment.

DETAILED DESCRIPTION OF THE PREFERRED EMBODIMENTS

Figure 4A:
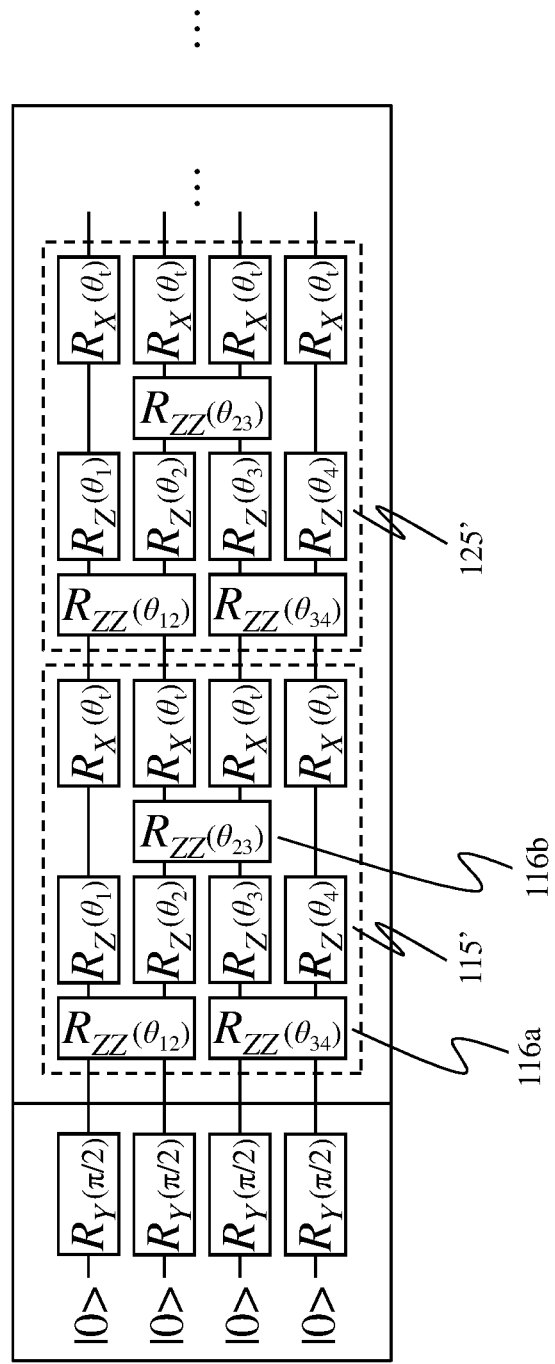
FIG. 4A is a circuit diagram in which commutative gates in FIG. 1B(b) are interchanged so that two-qubit gates are not consecutive.

Embodiments will be described in detail with reference to the drawings. However, the invention is not limited to the description of the embodiments illustrated below in interpretation. It is easily understood that a specific configuration thereof can be modified in the range without departing from the spirit or purpose of the invention by those skilled in the art.

In configurations of embodiments described below, the same reference numeral may be used in common for portions having the same function or similar functions among different drawings, and duplicate description thereof may be omitted.

When there are a plurality of components having the same function or similar functions, sometimes, the plurality of components may be described by adding different subscripts to the same reference numeral. However, when it is not necessary to distinguish the plurality of components, sometimes, the subscripts may be omitted in description.

Notations such as "first", "second", and "third" in this specification and the like are attached to identify components, which necessarily do not limit the number, order, or contents thereof. Further, a reference numeral for identifying a component is used for each context, and the reference numeral used in one context does not always indicate the same component in another context. Further, it does not prevent a component identified by a certain reference numeral from functioning as a component identified by another reference numeral.

In order to facilitate understanding of the invention, the position, size, shape, range, and the like of each configuration illustrated in the drawings and the like may not represent the actual position, size, shape, range, and the like. Therefore, the present invention is not necessarily limited to the position, size, shape, range, and the like illustrated in the drawings and the like.

The publications, patents, and patent applications cited in this specification constitute a portion of the description of the specification.

A component represented in a singular form herein is intended to include a plural form, unless explicitly stated in the context.

Let us summarize the contents disclosed in the embodiments. In a gate-type quantum computer, the state is initialized to the ground states of Hamiltonian $H_1$, and the Hamiltonian is gradually changed from $H_1$ to $H_0$. The Hamiltonian at each time is continued for about the relaxation time; the gate operation determined by each Hamiltonian is repeated for the time, and the state is longitudinally relaxed to the ground state of each Hamiltonian every time span (sequential initialization). The above-mentioned longitudinal relaxation every time span, where each Hamiltonian is maintained, is repeated so as to guide the state to the target ground state. In addition to the process, the following methods are used together.

(1) A distribution of the measured values is obtained by the repetition of guiding the state to the target ground state and measuring the state.

(2) A trial function (variational function) is set to reproduce the distribution obtained by the measurements, and the accuracy of a solution is improved by a variational method. Machine learning is also used to determine the trial function.

(3) A random gate and the inverse gate thereof are inserted between the gates (original gates) constituting a circuit determined by a Hamiltonian, and the original gates are randomized by integrating the original gates with the random gates to eliminate systematic errors.

First Embodiment

A physical system is generally equipped with the function causing the transition from a high-energy state to a low-energy state. This is called longitudinal relaxation. This embodiment is intended to achieve quantum computing using the longitudinal relaxation as a driving force. This principle is essentially different from that of ordinary quantum computers. The ordinary quantum computers are premised that the state is maintained without relaxation (so called coherent), and research and development are carried forward aiming at that premise.

As described above, the physical system naturally has the characteristics of causing the transition from a high-energy state to a low-energy state. In other words, the physical system has inherently incoherent properties. This embodiment describes utilizing the incoherent properties to run the quantum computer.

FIG. 1A illustrates an example of a hardware configuration for the quantum computer for the embodiment. For example, as disclosed in JP 2013-114366 A, a quantum computer 1000 utilizes, as hardware, a quantum register 1001 equipped with qubits, a control gate 1002 performing an operation on the quantum register 1001, and a readout unit 1003 observing a state of the quantum register 1001; thereby, the quantum computer 1000 operates as a processor or a memory. Such a quantum computer 1000 is generally controlled by a classical computer 2000.

Hereinafter, embodiments will be described with reference to specific examples. The problem to be solved is translated into a Hamiltonian form so that the solution is the ground state of Hamiltonian $H_0$. The Hamiltonian is defined for each problem to be solved. A combinatorial optimization problem can be translated into a ground state search problem of Ising spin Hamiltonian $H_0 = -\Sigma_{jk} J_{jk} Z_j Z_k - \Sigma_j h_j Z_j$ (refer to A. Lucas, arXiv: 1302.5843v3). Herein, $Z_j$ is the Z component of the Pauli's spin matrix, and $J_{jk}$ and $h_j$ are coefficients determined by the problem. Besides, Hamiltonian $H_0$ for the problems in quantum chemistry, pharmaceuticals, and quantum many-body systems, is given as per each system, and obtaining of the ground state is still a basic problem.

The embodiment uses an NISQ computer as a quantum computer 1000, which is a gate-type quantum computer not provided with an error correction function, as described above. The embodiment can be conducted by performing processes described below using a NISQ computer known at the time of filing and hardware belonging to the concept.

In order to obtain the ground state of $H_0$ first, the state of the quantum computer 1000 is set to the ground state of Hamiltonian $H_1$. For example, $H_1$ is $H_1 = -B\Sigma_j X_j$. Herein, $X_j$ is the X component of the Pauli's spin matrix, and B is an appropriate coefficient. The qubits can be intuitively understood as spin. Qubit state $|0\rangle$ corresponds to up-spin; qubit state $|1\rangle$ corresponds to down-spin. $H_1 = -B\Sigma_j X_j$ corresponds to a spin system in which a transverse magnetic field is uniformly applied, and B corresponds to the magnitude of the transverse magnetic field. When the spin is oriented in the direction of the magnetic field, the spin is in the ground state, and it is easy to obtain the ground state of the spin system. That is, it is easy to obtain the ground state of the Hamiltonian $H_1$. Why this is easy is because there is the longitudinal relaxation. However, it is not easy to obtain the ground state of $H_0$ instead of $H_1$. This is because there are many local minimum energy states in $H_0$ in general, and because the probability that the system will fall into these energy states through the longitudinal relaxation is high.

For this reason, first, let us prepare the ground state of Hamiltonian $H_1$ for the system; then, let us gradually change the Hamiltonian to lead to the ground state determined by the Hamiltonian at each time through the longitudinal relaxation. If the variation of Hamiltonian is only slight, the ground state is almost the same, and it is possible to lead to the correct ground state with a high probability. The longitudinal relaxation to the ground state determined by the Hamiltonian at each time is also said to be the initialization at each time.

As described in JP 2013-114366 A, in general, problem setting and controlling for the quantum computer 1000 can be executed by a classical computer (Von Neumann computer) 2000. That is, the problem to be solved is set by the classical computer 2000 that controls the quantum computer 1000. Based on the problem set by the classical computer 2000, the qubits in the quantum register 1001 are initialized to the ground state of the Hamiltonian $H_1$ by the control gate 1002. This operation is achieved by controlling the gates based on a control program 2001 loaded into the classical computer 2000. A configuration example of the classical computer 2000 is also described in JP 2013-114366 A and is omitted here.

FIG. 1B is a diagram illustrating the principle of the embodiment. FIG. 1B(a) is represented from the viewpoint of an energy diagram, and FIG. 1B(b) is an example of a specific quantum circuit for the quantum computer.

Let the Hamiltonian be $H(t)=s(t)H_0+[1-s(t)]H_1$ by using a parameter $s(t)$. As the parameter $s(t)$, let $s(t_0)=0$ at time $t=t_0$ and $s(t_0+T)=1$ at time $t=t_0+T$; $s(t)$ gradually varies from 0 to 1. The Hamiltonian at $t=t_0$ is $H(t_0)=H_1$, and the ground state thereof is $|\psi(t_0)\rangle$ (refer to FIG. 1B(a)).

The circuit of FIG. 1B is a case where the Hamiltonian is $H(t_j)=s(t_j)H_0+[1-s(t_j)]H_1$; herein, $H_0=-\Sigma_{jk}J_{jk}Z_jZ_k-\Sigma_j h_j Z_j$ and $H_1=-B\Sigma_j X_j$. If the Hamiltonian is changed, the quantum circuit will also be changed. The embodiment describes the case of the Hamiltonian described above as an example.

For example, the ground state of $H_1=-B\Sigma_j X_j$ is $|\psi(t_0)\rangle=|++\ldots+\rangle$. Herein, $|+\rangle=(|0\rangle+|1\rangle)/\sqrt{2}$. At time $t=t_0$, the state set to be $|\psi(t_0)\rangle$ is gradually changed. In the time span from $t=t_0$ to $t=t_1=t_0+\delta t_1$, the Hamiltonian is set to be $H(t_1)=s(t_1)H_0+[1-s(t_1)]H_1$, and the state is time-evolved. A unitary operator representing time evolution is given by $U_1=\exp[-iH(t_1)\delta t_1]$ according to the Schroedinger equation. Herein, Planck's constant is set to $h/2\pi=1$. $\delta t_1$ is set to be about a longitudinal relaxation time. Through the longitudinal relaxation (relaxation 100 to the ground state in FIG. 1B(a)), the state is close to the ground state $|\psi(t_1)\rangle$ of $H(t_1)=s(t_1)H_0+[1-s(t_1)]H_1$.

Similarly, in the time span from $t=t_1=t_0+\delta t_1$ to $t=t_2=t_1+\delta t_2$, the Hamiltonian is set to be $H(t_2)=s(t_2)H_0+[1-s(t_2)]H_1$, and the state is time-evolved. The unitary operator representing the time evolution is given by $U_2=\exp[-iH(t_2)\delta t_2]$. $\delta t_2$ is set to be about the longitudinal relaxation time. Through the longitudinal relaxation (relaxation 200 to the ground state in FIG. 1B(a)), the state is close to the ground state $|\psi(t_2)\rangle$ of $H(t_2)=s(t_2)H_0+[1-s(t_2)]H_1$. Hereafter, this is repeated. The minute time $\delta t_j$ is set so that $T=\Sigma_j \delta t_j$ is satisfied, i.e., T is divided into n portions. As a result of n repetitions, the state is close to the ground state $|\psi(t_n)\rangle$ of the $H(t_n)=H(t_0+T)=H_0$.

The change of Hamiltonian H is reflected in the unitary operation that is based on the Hamiltonian, and the change is reflected in the control gate that is the actor of the operation. However, the longitudinal relaxation used in the embodiment is not a unitary operation. Even if unitary operations are intended to perform, the transition from a high energy state to a low energy state is added as a natural phenomenon. That is the longitudinal relaxation.

A longitudinal relaxation time depends on a target system, and the longitudinal relaxation time can be obtained through a simulation or experiment. A value of the longitudinal relaxation time is roughly determined by a digit if the system is determined, but the digit is different depending on the system, and the value can be from microseconds to several tens of seconds or more.

Described so far is that the Hamiltonian is set to be $H(t_j)=s(t_j)H_0+[1-s(t_j)]H_1$ every span of $\delta t_j$, and the state is time-evolved with the unitary operator $U_j=\exp[-iH(t_j)\delta t_j]$.

In summary, the Hamiltonian is set to be $H(t)=s(t)H_0+[1-s(t)]H_1$ by using the parameter $s(t)$, and $s(t)$ gradually varies from $s(t_0)=0$ to $s(t_n)=1$ in the time from $t=t_0$ to $t=t_n=t_0+T$; the initial state is set to be the ground state $|\psi(t_0)\rangle$ of $H_1$; the unitary operation $U_1=\exp[-iH(t_1)\delta t_1]$ in the time from $t=t_0$ to $t=t_1=t_0+\delta t_1$, the unitary operation $U_2=\exp[-iH(t_2)\delta t_2]$ in the time from $t=t_1$ to $t=t_2=t_1+\delta t_2$, ... are performed; $\delta t_j$ ($j=1, 2, \ldots n$) is set to be about the longitudinal relaxation time; $T=\Sigma_j\delta t_j$ is satisfied; and the state is relaxed every span of $\delta t_j$, so that the initial state $|\psi(t_0)\rangle$ is time-evolved to $|\psi(t_0+T)\rangle$.

Next, a method of how to use the gates in the quantum computer will be illustrated by referring to the quantum circuit diagram in FIG. 1B(b) as an example. FIG. 1B(b) illustrates a case of a four-qubit system. An example of the Hamiltonian is $H_0=-\Sigma_{jk}J_{jk}Z_jZ_k-\Sigma_jh_jZ_j$ and $H_1=-B\Sigma_jX_j$ described above. First, a state $|\psi(t_{-1})\rangle=|0\ldots0\rangle$ is prepared for the input state 111 in FIG. 1B(b)) and Y-axis rotation $R_Y(\pi/2)$ is applied to each qubit (Y-axis rotation gate 112 in FIG. 1B(b)), thereby, the ground state of $H_1$, $|\psi(t_0)\rangle=|++\ldots+\rangle=[\Pi_jR_Y(\pi/2)_j]|0\ldots0\rangle$ (the state at $t=t_0$ in FIG. 1B(b) and the position 113 thereof), is obtained.

FIG. 2 is a conceptual diagram illustrating the relationship between the Bloch sphere and a qubit. The Y-axis rotation $R_Y(\pi/2)$ can be understood graphically by using the Bloch sphere illustrated in FIG. 2. The Bloch sphere illustrates $|0\rangle$ of a qubit with the north pole and $|1\rangle$ with the south pole. $|+\rangle=(|0\rangle+|1\rangle)/\sqrt{2}$ is expressed as $(x, y, z)=(1, 0, 0)$. Thus, $|+\rangle$ is obtained by rotating $|0\rangle$ around the Y axis by $\pi/2$. $R_Y(\pi/2)$ represents this operation. The mathematical expression of the Y-axis rotation is $R_Y(\theta)=\exp(-i\theta Y/2)$ using Y as the Y component of the Pauli's spin matrix. Similarly, $R_X(\theta)=\exp(-i\theta X/2)$, $R_Z(\theta)=\exp(-i\theta Z/2)$, and $R_I(\theta)=\exp(-i\theta/2)$.

$|\psi(t_0)\rangle=|++\ldots+\rangle$ is the eigenstate (ground state) with the eigenvalue $-B$ of $H_1=-B\Sigma_jX_j$, i.e., $H_1|\psi(t_0)\rangle=-B|\psi(t_0)\rangle$. When the Hamiltonian is kept $H_1$, the state time-evolves as $|\psi(t)\rangle=\exp[iB\Sigma_jX_j(t-t_0)]|++\ldots+\rangle$; $\exp[iB\Sigma_jX_j(t-t_0)]$ corresponds to the X-axis rotation on the Bloch sphere. Because the vector $(1, 0, 0)$ keeps $(1, 0, 0)$ under the rotation around the X-axis, the state keeps $|\psi(t_0)\rangle$ if the Hamiltonian is kept $H_1$.

The Hamiltonian in the time span from $t=t_0$ to $t=t_1=t_0+\delta t_1$ is $H(t_1)=s(t_1)H_0+[1-s(t_1)]H_1$ in the computation of the embodiment. When specifically described, $$H(t_1)=s(t_1)(-\Sigma_{jk}J_{jk}Z_jZ_k-\Sigma_jh_jZ_j)+[1-s(t_1)](-B\Sigma X_j).$$

When written as the unitary operator, $U_1=\exp(-i\{s(t_1)(-\Sigma_{jk}J_{jk}Z_jZ_k-\Sigma_jh_jZ_j)+[1-s(t_1)](-B\Sigma_jX_j)\}\delta t_1)$. Although the argument of the exponential function, which includes the X and Z operators, is composed of non-commutative operators, if the time span $\delta t_1$ is divided into N portions to make the time span minute, $U_1$ can be transformed into a product form where each factor consists of an individual operator. That is, $$U_1\approx\Pi_{p=1}^N\{\Pi_j\exp(-i[1-s(t_1)](-BX_j)\delta t_1/N)\times\Pi_j\exp[-is(t_1)(-h_jZ_j)\delta t_1/N]\times\Pi_{jk}\exp[-is(t_1)(-J_{jk}Z_jZ_k)\delta t_1/N]\}_p.$$

Let $\theta_x=2[1-s(t_1)](-B)\delta t_1/N$, $\theta_j=2s(t_1)(-h_j)\delta t_1/N$, $\theta_{jk}=2s(t_1)(-J_{jk})\delta t_1/N$, and $R_{ZZ}(\theta_{jk})=\exp(-i\theta_{jk}Z_jZ_k/2)$. Then, $\Pi_j\exp(-i[1-s(t_1)](-BX_j)\delta t_1/N)$ is a bundle of $R_X(\theta_x)$ that is the X-axis rotation for each qubit (the X-axis rotation gate 114 in FIG. 1B (b); $\Pi_j\exp[-is(t_1)(-h_jZ_j)\delta t_1/N]$ is a bundle of $R_Z(\theta_j)$ that is the Z-axis rotation for each qubit (Z-axis rotation gate 115 in FIG. 1B (b)); and $\Pi_{jk}\exp[-is(t_1)(-J_{jk}Z_jZ_k)\delta t_1/N]$ is a bundle of $R_{ZZ}(\theta_{jk})$ that is an operator per two qubits ($R_{ZZ}$ gate 116 in FIG. 1B (b)). When the ZZ interaction can be directly provided for the system, it may used for the $R_{ZZ}$ gate. If the interaction cannot be directly provided, the $R_{ZZ}$ gate is achieved using the CZ gate and the Z-axis rotation gate by utilizing the fact that the control phase gate is $CZ_{jk}=I-(I-Z_j)(I-Z_k)/2$.

As shown, when $U_1$ can be decomposed into the X-axis rotation gate, the Z-axis rotation gate, and the $R_{ZZ}$ gate, a quantum circuit can be configured by arranging these gates in series. FIG. 1B (b) illustrates this manner. Described is that the Hamiltonian $H(t)$ is decomposed into a sum of one-qubit operators with the coefficient h and two-qubit operators with the coefficient $J_{jk}$, and that the unitary operations corresponding to the terms with the coefficient $h_j$ and the unitary operations corresponding to the terms with the coefficient $J_{jk}$ are performed with one-qubit gates (114, 115) and multiple-qubit gates ($R_{ZZ}$ gate 116), respectively.

In the embodiment, specifically, Hamiltonian is $H(t)=\Sigma_jh_jZ_j+\Sigma_{jk}J_{jk}Z_jZ_k$ given by the sum of terms with the coefficient $h_j$ and terms with the coefficient $J_{jk}$; the unitary operation $U=\exp[-iH(t)\delta t]$ for the time span $\delta t$ is divided into N portions such that $U=\Pi_{q=1}^N\{\Pi_j[\exp(-ih_jZ_j\delta t/N)]\Pi_{jk}[\exp(-iJ_{jk}Z_jZ_k\delta t/N)]\}_q$, where each factor corresponds to each term in $H(t)$; the computation is performed using the one-qubit gates corresponding to the $\exp(-ih_jZ_j\delta t/N)$ and the two-qubit gates corresponding to the $\exp(-iJ_{jk}Z_jZ_k\delta t/N)$ which are the multiple-qubit gates.

Because $\delta t_1$ is divided into N portions in $U_1$, the same gate operation is repeated N times. Each gate operation is individual, i.e., operating in a digital manner. However, when the whole operations are seen in an average manner over the time span, the Hamiltonian corresponds to $H(t_1)=s(t_1)(-\Sigma_{jk}J_{jk}Z_jZ_k-\Sigma_jh_jZ_j)+[1-s(t_1)](-B\Sigma_jX_j)$. Since $\delta t_1$ is set to be about the longitudinal relaxation time, the system is relaxed to the ground state of $H(t_1)$ during time $\delta t_1$. The reason for N-division is for averaging the individual responses to the system by reducing the effect of each gate operation. From this purpose, N is preferably $N\approx10$ or more, but it is not always strict; the value may be determined in consideration of the longitudinal relaxation time of the system and the time required for each gate. $U_2, \ldots,$ and $U_n$ are similarly achieved based on $H(t_2), \ldots,$ and $H(t_n)$, respectively.

$|\psi(t_n)\rangle$ is obtained through the above gate processing. If $|\psi(t_n)\rangle$ is measured on the Z basis, an eigenvalue of $+1$ or $-1$ corresponding to $|0\rangle$ or $|1\rangle$, respectively, is obtained. A problem such as a combinatorial optimization problem takes $|0\rangle$ and $|1\rangle$ as the state of a solution. In this case, the measured value becomes a candidate for the solution as it is. If repeating the above operation and measurement, we obtain a plurality of candidates for the solution. We can select the optimum solution by checking the candidates for the solution one by one.

In quantum chemistry and many body problems, the solution is not $|0\rangle$ or $|1\rangle$ but is a superposition state $|\psi(t_n)\rangle=\Sigma_ia_i|i\rangle$. For an m-qubit system, $i=0, \ldots, 2^m-1$. When the measurement is performed, the wave packet converges to any of $|i\rangle$ in $|\psi(t_n)\rangle=\Sigma_ia_i|i\rangle$. The probability that the wave packet converges to $|i\rangle$ in each measurement is $|a_i|^2$, and the distribution of $|a_i|^2$ can be obtained by repeating the computation and measurement. That is, $|\psi(t_n)\rangle=\Sigma_ia_i|i\rangle$ can be roughly obtained. The obtained quantity is only $|a_i|^2$; the phase of $a_i$ is not determined. However, there is a symmetry in the solution for a problem in quantum chemistry and a quantum many-body system, and thus, even if the phase of $a_i$ cannot be measured accurately, when $|a_i|^2$ is obtained, it can be stated that the answer is roughly obtained. The method of restoring $a_i$ from $|a_i|^2$ including the phase will be described in the third embodiment.

Second Embodiment

In the first embodiment, it was stated that the computation and the measurement are repeatedly performed. Repeated executions give us a plurality of candidates for the solution for a problem in which the solution state is $|0\rangle$ or $|1\rangle$, and gives us a distribution of $|a_i|^2$ for a problem in which the solution state is $|\psi(t_n)\rangle = \Sigma_i a_i |i\rangle$. Repeating computations and measurements has also the role of mitigating effects of operation errors.

When the solution state is $|\psi(t_n)\rangle = \Sigma_i a_i |i\rangle$, a wave packet converges to one of $|i\rangle$ at a measurement. However, there is a possibility that the wave packet may converge to $|j\rangle$ that does not constitute $|\psi(t_n)\rangle = \Sigma_i a_i |i\rangle$ owing to an initialization error, a gate error, and a measurement error. However, if errors are sufficiently random, by increasing the number of samplings, it is possible to make the wave packet converge to the correct $|i\rangle$ as an average value.

This is illustrated in FIG. 3. Only the peaks provide the solution, and the widths of the peaks are brought from operation errors. That is, it is possible to eliminate the operation errors through a large number of measurements.

For enabling this exclusion method to function, the errors need to be sufficiently random, and systematic errors (coherent errors) must not exist. For this reason, a random gate and its inverse gate are added in pairs to eliminate the systematic errors on average. In addition, the random gate and the inverse gate are separately integrated with the original gates to prevent the number of gates from increasing.

Figure 4B:
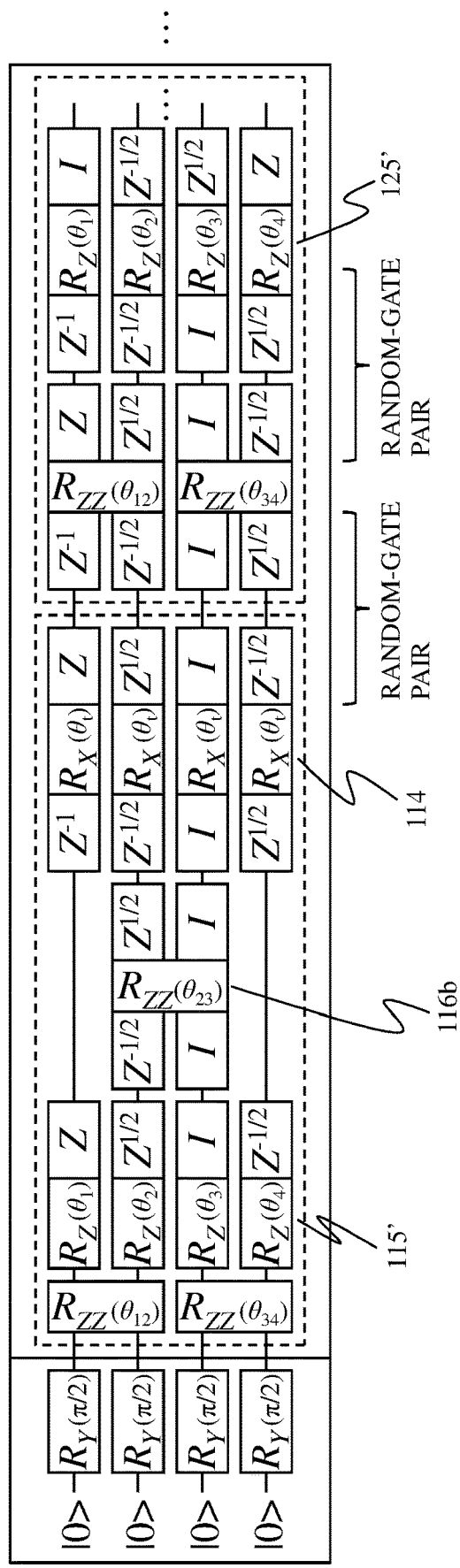
FIG. 4B is a circuit diagram in which a random gate is chosen every partition delimited by $R_Z$ gates, and the chosen random gate and the inverse gate thereof are inserted between all the gates in the partitions.
Figure 4C:
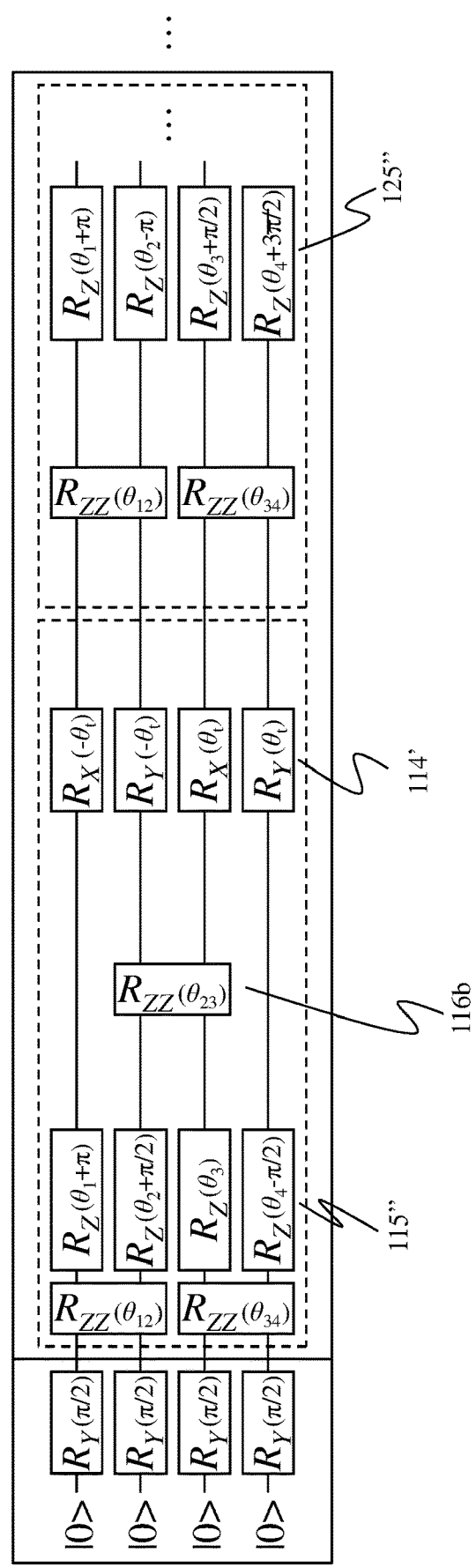
FIG. 4C is a circuit diagram in which each original gate and a random gate and an inverse gate inserted before and after the original gate are integrated into one gate.
Figure 4D:
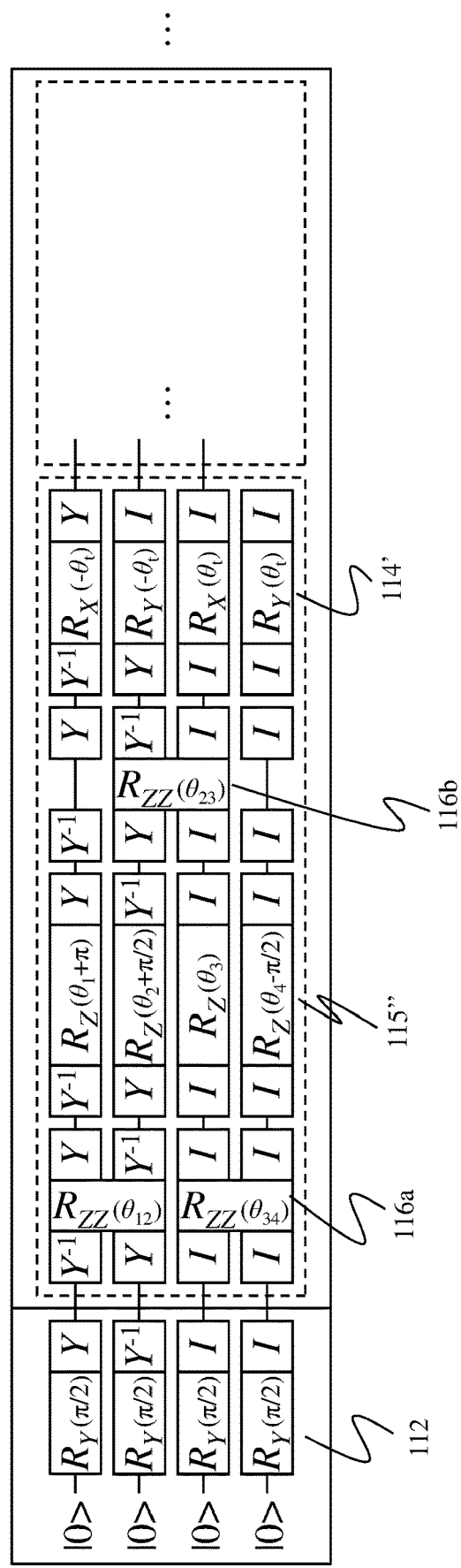
FIG. 4D is a circuit diagram in which a random gate is chosen every partition delimited by $R_Y$ gates, and the chosen random gate and the inverse gate thereof are added.
Figure 4E:
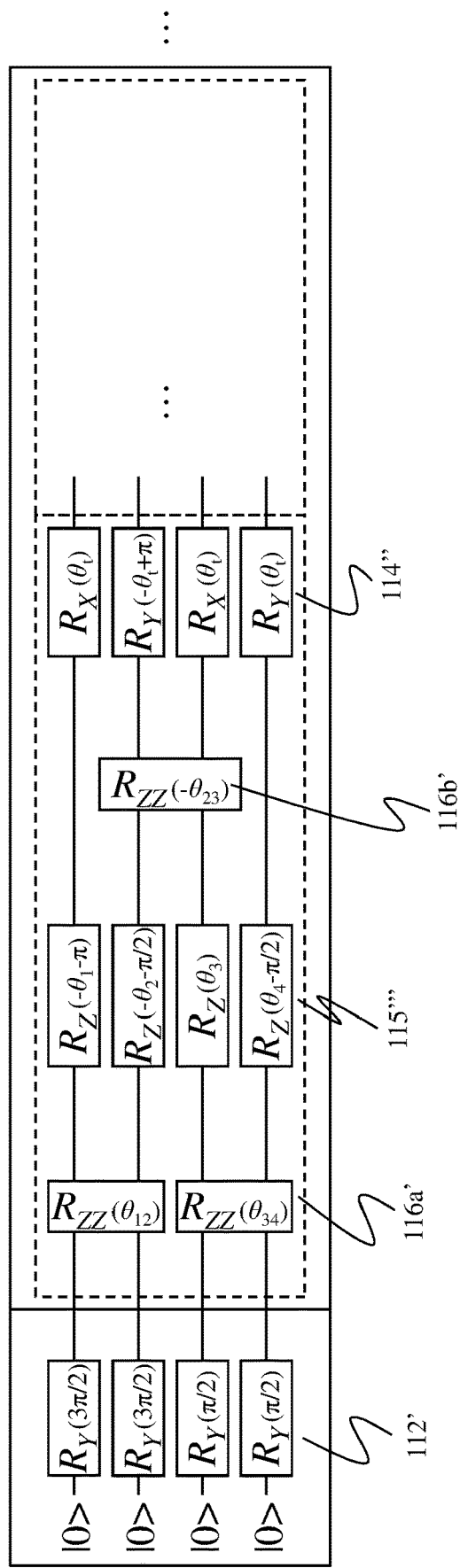
FIG. 4E is a circuit diagram in which each original gate and a random gate and its inverse gate inserted before and after the original gate are integrated into one gate.

FIGS. 4A to 4E illustrate an example of a procedure for randomizing each gate of the quantum circuit in FIG. 1B(b). FIG. 4A is a circuit diagram in which the commutative gates in FIG. 1B(b) are interchanged so that the two-qubit gates are not consecutive. FIG. 4B is a diagram in which a random gate is chosen every partition delimited by $R_Z$ gates, and the chosen random gate and its inverse gate are inserted between all the gates in the partitions. FIG. 4C is a diagram in which each original gate and a random gate and an inverse gate inserted before and after the original gate are integrated into one gate. FIG. 4D is a diagram in which a random gate is chosen every partition delimited by $R_Y$ gates, and the chosen random gate and the inverse gate thereof are added. FIG. 4E is a diagram in which each original gate and a random gate and an inverse gate inserted before and after the original gate are integrated into one gate. FIG. 1B(b) and FIGS. 4A to 4E perform the same task, but in the quantum circuit of FIG. 4E, the systematic errors are cancelled on average.

In the procedure, the following properties are used. Herein, Pauli matrices $\sigma_i \in \{X, Y, Z\}$ and rotation gates $R_i(\theta) \in \{R_X(\theta), R_Y(\theta), R_Z(\theta)\}$ are expressed together using the subscript i. $\sigma_i = iR_i(\pi)$, $\sigma_i^{\pm 1/2} = \exp(\pm i\pi/4)R_i(\pm \pi/2)$, and $\sigma_i$ and $R_i(\theta)$ are commutative. When $i \ne j \ne k$, $\sigma_i R_j(\theta)\sigma_i = R_j(-\theta)$, $\sigma_i^{1/2} R_j(\theta) \sigma_i^{-1/2} = R_k(\varepsilon_{ijk}\theta)$, and $\sigma_i^{-1/2} R_j(\theta)\sigma_i^{1/2} = R_k(-\varepsilon_{ijk}\theta)$. Herein, $\varepsilon_{XYZ} = \varepsilon_{YZX} = \varepsilon_{ZXY} = +1$, and $\varepsilon_{XZY} = \varepsilon_{ZYX} = \varepsilon_{XZY} = -1$.

Procedure 1: Two-qubit gates are moved such that not lined up consecutively as much as possible. In FIG. 1B(b), the $R_{ZZ}(\theta_{12})$ and $R_{ZZ}(\theta_{23})$ gates are consecutively arranged, and the $R_{ZZ}(\theta_{34})$ and $R_{ZZ}(\theta_{23})$ gates are consecutively arranged (116). The $R_{ZZ}(\theta_{23})$ gate and the $R_Z(\theta_j)$ gates of 115 are interchanged by noting that the gates are commutative ($R_{ZZ}$ gate 116b and Z-axis rotation gate 115' in FIG. 4A).

Procedure 2:

2.1: Let us select one of $R_X$, $R_Y$, and $R_Z$, which constitutes the circuit with the maximum number. The numbers of $R_X$ and $R_Z$ are the same in FIG. 4A. Then, let us choose $R_Z$ as a gate with the maximum number.

2.2: Let the gate selected in 2.1 be $R_j$ ($R_Z$ in 2.1). The circuit is partitioned every $R_j$ appearing; a random gate is chosen from $\{I, \sigma_i, \sigma_i^{-1}, \sigma_j^{1/2}, \sigma_i^{-1/2}\}$ for each partition, and the chosen random gate and its inverse gate are inserted between all the gates in the partition. Since the random gate and its inverse gate are paired, this circuit is equivalent to the original circuit (FIG. 4B). Here, when there is a two-qubit gate $R_{ii}$ ($i \ne j$) in the partition delimited by each $R_j$, the random gate pair is set to be $\{I, \sigma_i, \sigma_i^{-1}\}$. The partition in FIG. 4B is delimited by $R_Z$ gates. For example, the two-qubit gates existing in the partition from 115' to the Z-axis rotation gate 125' are $R_{ZZ}$ gates, i.e., i=j. Thus, the random gate is $\{I, Z, Z^{-1}, Z^{1/2}, Z^{-1/2}\}$.

2.3: The chosen random gate and its inverse gate are integrated with the original gates in the rear and front thereof, respectively (FIG. 4C). Gates 114, 115', and 125' in FIG. 4B becomes respectively gates 114', 115", and 125" in FIG. 4C, where gate 114' is obtained by integrating the X-axis rotation gate with the random gate, gate 115' is obtained by integrating the Z-axis rotation gate with the random gate, and gate 125" is obtained by integrating the Z-axis rotation gate with the random gate.

Procedure 3: The gate with the maximum number, except $R_j$ selected in 2.1, is selected, and the procedure 2 is performed in the same manner. The gate should be $R_X$ in FIG. 4C. However, $R_X$ is not sufficiently shown owing to the limited space. Therefore, the procedure 3 is skipped in the example using FIG. 4.

A procedure 4: The procedure 2 is performed similarly for the remaining $R_j$ not selected in 2.1 and the procedure 3. $R_Y$ is the correspondence in FIG. 4. There is $R_{ZZ}$ gates in the partition delimited by $R_Y$ gates. For this reason, the random gate of 2.2 becomes $\{I, Y, Y^{-1}\}$ (FIG. 4D). The integration in accordance with 2.3 results in FIG. 4E. Gates 112, 114', 115", 116a, and 116b in FIG. 4D respectively become gates 112', 114", 115"', 116a', and 116b' in FIG. 4E, where 112' is obtained by integrating the Y-axis rotation gate with the random gate, a gate 114" is obtained by integrating the gate 114' with the random gate, a gate 115"' is obtained by integrating the gate 115" with the random gate, and gates 116a' and 116b' are obtained by integrating the $R_{ZZ}$ gate with the random gate.

A procedure 5: These procedures complete the gate randomization. The procedures 2 to 4 may be repeated to further randomize. The selection of R in the procedures 2 to 4 is maintained as it is.

Through the above integrations, 112, 114, 115, and 116 in FIG. 1B(b) become 112', 114", 115"', 116a', and 116b' in FIG. 4E. We can see that the gates are randomized by comparing both figures. This randomization is performed every operation/measurement for a circuit. As a result, the systematic errors are eliminated on average. By randomizing the gates, the function of cancelling systematic errors is embedded in the circuit itself. When the randomization is performed for each operation/measurement, the effect of the cancellation will be further improved.

Thanks to the systematic errors eliminated, the peak can be obtained at the correct positions in FIG. 3.

FIG. 1B(b) and FIGS. 4A to 4E illustrate circuit diagrams where the $R_{ZZ}$ gate can be directly obtained. When the $R_{ZZ}$ gate cannot be directly obtained, it is achieved using the CZ gate and the Z-axis rotation gate based on the relation of $CZ_{jk}=I-(I-Z_j)(I-Z_k)/2$.

Figure 5:
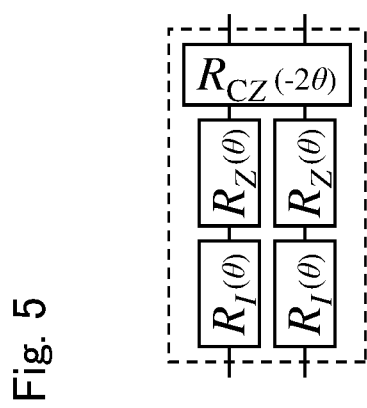
FIG. 5 is a circuit diagram of an $R_{ZZ}$ gate decomposed into $R_I$, $R_Z$, and $R_{CZ}$ gates.

FIG. 5 is a diagram obtained by rewriting the $R_{ZZ}(\theta)$ gate in FIG. 1B(b) according to $Z_j Z_k=I+Z_j+Z_k-2CZ_{jk}$. Since the phase $R_I(\theta)=\exp(-i\theta/2)$ based on the identity gate I does not affect the measured value, the phase $R_I(\theta)=\exp(-i\theta/2)$ is usually omitted in a circuit diagram, but since it is necessary to consider this phase in designing a circuit, the phase $R_I(\theta)=\exp(-i\theta/2)$ is explicitly drawn in FIG. 5.

Third Embodiment

We stated that the embodiment can be applied even when the solution is in a linear superposition state $|\psi(t_n)\rangle=\Sigma_i a_i |i\rangle$ in the first embodiment. In quantum chemistry and many-body systems, a problem is to find the state of many-body electron systems, just treating $|\psi(t_n)\rangle=\Sigma_i a_i |i\rangle$. In particular, the obtaining the ground state is a basic problem.

Electrons are fermions; thus they have different properties from qubits. However, fermions can only take two states of occupied and unoccupied; the property resembles that of qubits only taking $|0\rangle$ or $|1\rangle$. For this reason, fermions can be represented using qubits according to a certain transformation rule.

According to the transformation rule, the Hamiltonian of an m-body electron system is generally described by

[Mathematical Formula 1]

$$H_0 = \Sigma_j f_j P_j, \quad P_j \in \{I, X, Y, Z\}^{\otimes m}$$

(refer to A. Kandala, et al., Nature 549, 242 (2017)). Herein, $f_j$ is a coefficient determined by the overlap of electron orbits, and the like, and $P_j$ is a tensor product of m I's and Pauli operators. For example, the ground state of the hydrogen molecule is, which is in a two-electron system, is obtained with sufficient accuracy with each is state of the two atoms being taken into consideration. The Hamiltonian, transformed into a qubit form, is $H_0=f_0 I_1 I_2 + f_1 Z_1 Z_2 + f_2 Z_1 I_2 + f_3 I_1 Z_2 + f_4 X_1 X_2$ (refer to N. Moll, et al., Quantum Sci. Technol. 3, 030503 (2018)).

The ground state of $H_0$ is obtained by setting $H_1=-B(X_1+X_2)$ and by performing an operation according to the procedure illustrated in FIG. 1B.

Figure 6:
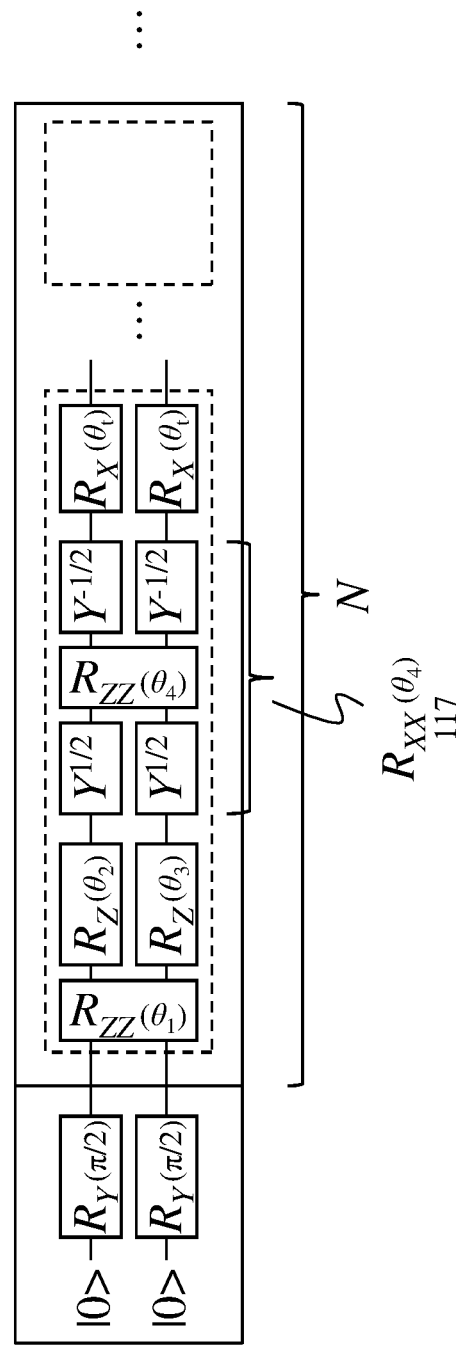
FIG. 6 is a circuit diagram for obtaining the ground state of hydrogen molecules.

FIG. 6 is a circuit diagram illustrating the case of obtaining the ground state of hydrogen molecules. Herein, the term of $f_0$ is omitted because the term only provides an offset. Since $R_{XX}(\theta)=(Y_1^{-1/2} Y_2^{-1/2}) R_{ZZ}(\theta)(Y_1^{1/2} Y_2^{1/2})$ due to the relation of $R_X(-\theta)=Y^{-1/2} R_Z(\theta) Y^{1/2}$, the $R_{XX}$ gate can be transformed into the $R_{ZZ}$ operator ($R_{XX}$ gate 117 achieved with the $R_{ZZ}$ gate and the Y-axis rotation gate). FIG. 6 is based on this transformation. The circuit in FIG. 6 may be randomized in the same manner as in FIGS. 4A to 4E. Moreover, the $R_{ZZ}$ gate can be further transformed into a CZ gate and rotation gates as in the case of FIG. 5.

Let us suppose performing a plurality of operations for the circuit in FIG. 6 and obtaining a distribution of $|a_i|^2$. For example, let us assume the result is $|a_{00}|^2 \approx 0.5$ and $|a_{11}|^2 \approx 0.5$. Herein, the subscript i is binary-represented. In this case, the expected form of the solution is $|\psi\rangle=a_{00}|00\rangle+a_{11}|11\rangle$. Then, if the parameters $a_{00}$ and $a_{11}$ are determined using a variational method so that the expected value $E=\langle\psi|H_0|\psi\rangle$ is minimized, $a_i$ can be determined to include the phase. Here, in this example, the variational parameters (computational complexity) can be reduced if the condition $|a_{00}|=|a_{11}|$ is added.

A variational method is a method in which the parameter $a_i$ is gradually varied to calculate E, and the $a_i$ providing the minimum E is output as a final solution. As in this example, a variational computation for a small electron system is easy. However, the amount of the variational computation increases as the number of electrons increases. In that case, it is effective to prepare $|\psi\rangle$ by using the quantum computer; the method called Variable Quantum Eigensolver (VQE) corresponds to just the method.

In this example, the trial function of the variational computation can be easily predicted as $|\psi\rangle=a_{00}|00\rangle+a_{11}|11\rangle$. As the number of electrons increases, it may be difficult to predict a trial function itself. In that case, it is also effective to use various machine learning methods. For example, let us deal with a method called restricted Boltzmann machine; the target is how to represent $a_i$ in $|\psi\rangle=\Sigma_i a_i |i\rangle$. Let $c_i$, $d_j$, and $W_{ij}$ be variational parameters; let $v=(v_1, v_2, \ldots)$ be a variable in an area called a visible layer; and let $h=(h_1, h_2, \ldots)$ be a variable in an area called a hidden layer. Let us define a virtual energy function $E(v, h)$ as $$E(v,h)=-\Sigma_i c_i v_i - \Sigma_j d_j h_j - \Sigma_{ij} W_{ij} v_i h_j.$$

Then, $a_i$ is described using $E(v, h)$. Herein, $v_i, h_j = \pm 1$. Let $Z=\Sigma_{v,h} \exp[-\Sigma(v, h)]$ that is the partition function. Then, $p(v, h)=\exp[-\Sigma(v, h)]/Z$ corresponds to the appearance probability of $(v, h)$. When trace is taken with respect to the variable $h$ for the hidden layer, $a(v)=\Sigma_h p(v, h)$. Let the binary representation of i for $a_i$ be $i_{m-1} i_{m-2} \ldots 0$; let us rewrite them to $v_{m-1} v_{m-2} \ldots v_0$, where $\{0, 1\}$ is replaced by $\{+1, -1\}$; then, $a(v)$ corresponds to $a_i$. That is, if $c_i$, $h_j$, and $W_{ij}$ are determined by the variational computation so that $|a(v)|^2=|a_i|^2$, the state $|\psi\rangle=\Sigma_i a_i |i\rangle$ can be obtained. Moreover, if the variational computation is performed using the $|\psi\rangle=\Sigma_i a_i |i\rangle$ obtained in this way as a trial function, where $E=\langle\psi|H_0|\psi\rangle$ is minimized, then $|\psi\rangle=\Sigma_i a_i |i\rangle$ with a high accuracy is obtained.

Let us describe the method of machine learning more generally. It is stated that "the variational function $|\psi(\lambda)\rangle$ is assumed to be determined by the parameter $\lambda$; let $|\psi(\lambda)\rangle=\Sigma_j a_j(\lambda)|j\rangle$ by expanding $|\psi(\lambda)\rangle$ by $|j\rangle$; and the parameter $\lambda$ is determined so that $|a_j(\lambda)|^2$ fits the above-mentioned probability distribution". In the case of the restricted Boltzmann machine, $c_i$, $d_j$, and $W_{ij}$ correspond to $\lambda$, and $a_j(\lambda)$ corresponds to $a(v)=\Sigma_h p(v, h)$.

Next, let $a_j(\lambda)$ obtained with the parameter $\lambda$ be the initial value of $a_j$; let $|\psi\rangle=\Sigma_j a_j|j\rangle$ be the variational function. By repeating the computation to find E by varying the parameter $a_j$, which is the variational computation to find the lowest value of the expected value $E=\langle\psi|H_0|\psi\rangle$, we can output $a_j$ providing the lowest value of E as a final solution.

FIG. 7 illustrates a series of processes as a block diagram. The problem is set (S701); it is translated into a circuit (S702); and the gate and random gates are integrated as described in FIGS. 1B to 6 (S703). The ground state $|\psi(t_0+T)\rangle$ of the Hamiltonian $H_0$ which is defined as a problem is repeatedly computed and measured (S704), where the measurements are on the Z basis, and the quantum register 1001, the control gate 1002, and the readout unit 1003 are controlled in the repeated computation; thus, the probability distribution of the measured values for $|\psi(t_0+T)\rangle$ is obtained (S705). In case of performing the variational computation, an appropriate trial function is selected (S706), and the ground state of the Hamiltonian $H_0$ is estimated with the variational computation (S707). As described above, machine learning (S708) may be used to determine the trial function.

The method of the embodiment achieves the quantum computing by using the longitudinal relaxation phenomena as a driving force. The ground state corresponds to a correct state, and the excited state corresponds to an incorrect state. The transition to the excited state that can occur during the computation corresponds to an operation error. Since the excited state is longitudinally relaxed to the ground state, the operation error is naturally corrected. That is, error correction is executed with natural properties of a physical system. Therefore, the method of the embodiment can also be applied to a gate-type quantum computer that does not perform quantum error correction, such as a NISQ computer.

According to the embodiment, quantum computing using the longitudinal relaxation as a driving force enables the gate-type quantum computer (the NISQ computer) that does not have an error correcting function to deal with actual problems. That is, the embodiment enables the quantum computer with operation noise applicable to general actual problems without error corrections.

In addition, since the quantum computer is of a gate type, which can perform arbitrary unitary operations (universal quantum computer), it can deal with general problems without an limitation such as that to combinatorial optimization problems. Furthermore, there are some effect: (1) Since the distribution of the measured values is obtained, the solution of each qubit does not need to be a binary value of 0 and 1, and quantum mechanical problems in which the linear superposition state of |0> and |1> becomes a solution can be dealt with. (2) The accuracy of a solution can be improved if combined with a variational method and/or machine learning. (3) It is possible to eliminate the systematic errors, which improves the accuracy of the solution.

What is claimed is:

1. A quantum computer comprising:
a quantum register holding qubits,
a control gate performing an operation on the quantum register, and
a readout unit observing a state of the quantum register;
wherein the quantum computer repeats a longitudinal relaxation to a ground state by gradually changing a Hamiltonian H(t) for a predetermined time,
wherein the Hamiltonian H(t) is a problem to be solved, and
wherein a unitary operation determined by the Hamiltonian H(t) at each time is performed by the control gate over a time of a longitudinal relaxation time, the quantum state is relaxed every time of the longitudinal relaxation time, and the ground state prepared for an initial state is time-evolved to the ground state of the Hamiltonian.

2. The quantum computer according to claim 1,
wherein the unitary operation $U=\exp[-iH(t)\delta t]$ determined by the Hamiltonian H(t) is performed by the control gate configured with one-qubit gates and multiple-qubit gates,
wherein the Hamiltonian is set to be $H(t)=s(t)H_0+[1-s(t)]H_1$ by using a parameter s(t),
wherein the s(t) gradually varies from $s(t_0)=0$ to $s(t_n)=1$ in the time from $t=t_0$ to $t=t_n=t_0+T$,
wherein the initial state is set to be the ground state $|\psi(t_0)\rangle$ of $H_1$,
wherein the unitary operation is $U_1=\exp[-iH(t_1)\delta t_1]$ in the time from $t=t_0$ to $t=t_1=t_0+\delta t_1$, the unitary operation is $U_2=\exp[-iH(t_2)\delta t_2]$ in the time from $t=t_1$ to $t=t_2=t_1+\delta t_2$, . . . ,
wherein $\delta t_j$ (j=1, 2, . . . , n) is set to be about the longitudinal relaxation time, and $T=\Sigma_j n\delta t_j$ is satisfied, and
wherein the state is relaxed every time of $\delta t_j$, so that the initial state $|\psi(t_0)\rangle$ is time-evolved to $|\psi(t_0+T)\rangle$.

3. The quantum computer according to claim 2,
wherein the Hamiltonian H(t) is decomposed into a sum of one-qubit operators with the coefficient $h_j$ and two-qubit operators with the coefficient $J_{jk}$,
wherein the unitary operation determined by the one-qubit operators with the coefficient $h_j$ is performed with the one-qubit gates, and the unitary operation determined by the two-qubit operators with the coefficient $J_{jk}$ is performed with the multiple-qubit gates, and
wherein computation is achieved with gate operations.

4. The quantum computer according to claim 3,
wherein the unitary operation $U=\exp[-iH(t)\delta t]$ for a time span $\delta t$ is divided into N-portions, where the Hamiltonian is $H(t)=\Sigma_j h_j Z_j+\Sigma_{jk} J_{jk} Z_j Z_k$ which is given by a sum of the operators with the coefficient $h_j$ and the operators with the coefficient $J_{jk}$, the terms of H(t) are individually treated, and thus $U=\Pi_{q=1}^N\{\Pi_j[\exp(-i\ h_j Z_j \delta t/N)]\Pi_{jk}[\exp(-iJ_{jk}Z_j Z_k \delta t/N)]\}_q$, and
wherein the computation is achieved with the one-qubit gate operations corresponding to $\exp(-ih_j Z_j \delta t/N)$ and the two-qubit gate operations which are the multiple-qubit gate operations corresponding to the $\exp(-iJ_{jk}Z_j Z_k \delta t/N)$.

5. The quantum computer according to claim 2, wherein $|\psi(t_0+T)\rangle$ is measured on the Z basis, the computation for obtaining the $|\psi(t_0+T)\rangle$ and measurement are repeated, and thereby a probability distribution of measured values with respect to $|\psi(t_0+T)\rangle$ is obtained, so that the ground state of the Hamiltonian $H_0$ can be estimated.

6. The quantum computer according to claim 1,
wherein one-qubit gates are classified regarding their rotation axis,
wherein a series of quantum circuits are partitioned based on the one-qubit gate with a certain rotation axis,
wherein a random gate is chosen every partition, the chosen random gate and the inverse gate thereof are inserted between all gates in each partition, and
wherein the random gate and the inverse gate thereof are separately integrated with a gate in an original circuit, thereby randomizing the gates.

7. The quantum computer according to claim 6,
wherein the random gate is commutative with the one-qubit gate of the certain rotation axis.

8. The quantum computer according to claim 6,
wherein let the certain rotation axis be the i-axis, and let $\sigma_i$ be the Pauli matrix, then the random gate is $\{I, \sigma_i, \sigma_i^{-1}\}$ or $\{I, \sigma_i, \sigma_i^{-1}\ \sigma_i^{1/2}, \sigma_i^{-1/2}\}$.

9. The quantum computer according to claim 5,
wherein a variational function is set to be $|\psi\rangle=\Sigma_j a_j|\rangle$, the initial value of the parameter $a_j$ is set so that $|a_j|^2$ fits the probability distribution, an expected value $E=\langle\psi|H_0|\psi\rangle$ is computed, the computation of obtaining E is repeated by gradually varying the parameter $a_j$, and the $a_j$ providing the lowest value of E is output as a final solution.

10. The quantum computer according to claim 5,
wherein a variational function $|\psi(\lambda)\rangle$ is determined by a parameter $\lambda$, and when $|\psi(\lambda)\rangle$ is expanded by $|j\rangle$ and it is set to be $|\psi(\lambda)\rangle=\Sigma_j a_j(\lambda)|j\rangle$, the parameter $\lambda$ is determined so that $|a_j(\lambda)|^2$ fits the probability distribution.

11. The quantum computer according to claim 10,
wherein $a_j(\lambda)$ determined with the parameter $\lambda$ is set as the initial value of $a_j$, $|\psi\rangle = \Sigma_j a_j |j\rangle$ is set as the variational function, a variational computation of obtaining a lowest value of an expected value $E = \langle \psi | H_0 | \psi \rangle$ is performed, and the $a_j$ providing the lowest value of the E is output as a final solution.

12. The quantum computer according to claim 9,
wherein the generation of the variational function $|\psi\rangle$ is performed with VQE.

13. A method of controlling a quantum state in a quantum computer having a quantum register holding qubits, a control gate performing an operation on the quantum register, and a readout unit observing a state of the quantum register, wherein the qubits are controlled by the control gate, wherein the Hamiltonian H(t) is a problem to be solved, the method comprising:
   repeating a longitudinal relaxation to a ground state by gradually changing a Hamiltonian H(t) for a predetermined time;
   allowing the control gate to perform the unitary operation determined by the Hamiltonian H(t) at each time spending a predetermined time to relax the quantum state every predetermined time; and
   time-evolving the ground state prepared for the initial state to the ground state of the Hamiltonian.

14. The method according to claim 13,
wherein the quantum computer is a NISQ computer.

15. The method according to claim 13,
wherein the predetermined time corresponds to a longitudinal relaxation time.

* * * * *